United States Patent [19]
Goeke

[11] Patent Number: 5,117,227
[45] Date of Patent: May 26, 1992

[54] CONTINUOUSLY INTEGRATING HIGH-RESOLUTION ANALOG-TO-DIGITAL CONVERTER

[75] Inventor: Wayne C. Goeke, Fort Collins, Colo.

[73] Assignee: Hewlett-Packard Company, Palo Alto, Calif.

[21] Appl. No.: 767,006

[22] Filed: Sep. 27, 1991

[51] Int. Cl.⁵ .............................................. H03M 1/50
[52] U.S. Cl. ..................................... 341/166; 341/156
[58] Field of Search ................ 341/156, 162, 166, 167

[56] References Cited

U.S. PATENT DOCUMENTS

| | | | |
|---|---|---|---|
| 4,128,885 | 12/1978 | Valek et al. | 364/424 |
| 4,605,920 | 8/1986 | Naisuler | 341/166 |
| 4,654,635 | 3/1987 | Van de Plassche | 341/156 |
| 4,896,155 | 1/1990 | Craiglow | 341/120 |
| 4,965,578 | 10/1990 | Poujois | 341/156 |

Primary Examiner—Marc Hoff

[57] ABSTRACT

A continuously integrating analog-to-digital converter (ADC) calculates a digital output by integrating an input voltage over a number of time intervals using a multisloping technique to define the input voltage in terms of a slope count. A residue ADC is used in lieu of a run-down interval of the integrator to calculate the least significant bits of the ADC digital output. This is accomplished by first sampling the integrator output voltage, and then after a number of time intervals, sampling the integrator output voltage a second tune. The difference between the two residue voltages is converted into a fractional slope count by multiplication with a calibration constant. The fractional slope count can then be added to the slope count from the integrator, so that the resulting total slope count is directly proportional to the input voltage at a high resolution. Multiplication by the calibration constant may be effectuated by controlling the gain on the residue ADC with a digital-to-analog converter (DAC), or like device.

10 Claims, 8 Drawing Sheets 5,117,227

CONTINUOUSLY INTEGRATING HIGH-RESOLUTION ANALOG-TO-DIGITAL CONVERTER

BACKGROUND OF THE INVENTION

I. Field of the Invention

The present invention is related to the field of analog-to-digital converter (ADC) technology, and more particularly, to a continuous integrating ADC which has a residue ADC for optimizing speed and resolution.

II. Related Art

Integrating ADCs, as opposed to other types of ADCs, have been used in the art because of their ability to make high-resolution measurements. However, integrating ADCs have been relatively slow historically. Numerous attempts have been made to increase the speed of such integrating ADCs without adversely affecting the resolution of their outputs. But, such efforts have had only limited success because the speed of the integrating ADCs is generally inversely proportional to the resolution of the output. In other words, in integrating ADCs, speed has generally been traded off for resolution.

A traditional integrating ADC is illustrated in FIG. 1. Generally, the integrating ADC converts an unknown input voltage $V_{IN}$ into a digital signal, known in the art as an "integrator count." An integrator 102 is comprised of an operational amplifier (op-amp) 104 and a parallel capacitor $C_1$. The integrator 102 receives the unknown input voltage $V_{IN}$ and provides an integrator output voltage $V_{INT}$ to a comparator 108. The comparator 108 compares $V_{INT}$ to a reference voltage, which oftentimes is ground, as shown in FIG. 1. The comparator 108 then feeds a comparator output voltage $V_C$ to the control logic 110, which in turn controls a switch SW1. The switch SW1 is controlled to provide either the input voltage $V_{IN}$ or a reference voltage $V_{REF}$ at any given instance. The reference voltage $V_{REF}$ can be any means for providing charge to the integrator 102. The reference voltage $V_{REF}$ can be positive or negative and can even be a current source, instead of a voltage source as shown. Further, the control logic 110 outputs the slope count, as indicated at a line 114.

Historically, a technique known as dual slope integration has been employed by traditional integrating ADCs, as shown in FIG. 1, in order to generate a digital output. Specifically, the unknown input voltage $V_{IN}$ is applied to the integrator 102 for a so-called "run-up" (RU) interval of duration T, as illustrated in FIG. 2. The input voltage $V_{IN}$ is then disconnected and, at the same time, a reference discharging voltage $V_{REF}$ is applied to the integrator 102 during a so-called "run-down" (RD) interval. The RD interval ends when the capacitor $C_1$ is totally discharged and, accordingly, the integrator output voltage $V_{INT}$ is zero.

The duration t of the RD interval is measured, and the value of the unknown input voltage $V_{IN}$ is computed as follows: $V_{IN} = t \times (V_{REF}/T)$. The value of duration t is typically measured by counting (usually synchronous with the clock) during the RD interval. For a given count, the sensitivity of the ADC increases with a decrease in the rate at which the discharge occurs. Therefore, sensitivity can be increased by decreasing the magnitude of $V_{REF}$. However, the decrease $V_{REF}$ results in a slower response of the circuit, which is impractical in many instances.

The sensitivity can also be increased by increasing the maximum voltage $V_M$ of the integrator output voltage $V_{INT}$ for a fixed duration of the RU interval. An increase in the maximum integrator output voltage $V_M$ is achieved by reducing the value of the input resistance $R_{IN}$ to increase the slope of the integrator output voltage $V_{INT}$ during the RU interval. However, for an op-amp integrator 102, the integrator output voltage $V_{INT}$ must be within the bounds of the op-amp power supply voltage limits.

In order to maintain high sensitivity and, at the same time increase the response time of an integrating ADC, a technique known as "multisloping" has been devised by those skilled in the art. U.S. Pat. No. 4,357,600 to Ressmeyer, which is incorporated herein by reference, describes the use of multisloping for producing a digital manifestation of an unknown input voltage $V_{IN}$.

Generally, multisloping can be employed during both the RU and RD intervals. Essentially, multisloping is a modification of the dual-slope integration wherein the integrating ADC is allowed to have an effective voltage swing much larger than the physical limitations of the integrator circuit hardware. The multisloping technique involves periodically applying a positive and/or negative reference voltage $V_{REF}$ to the integrator input so that the charge from the unknown input voltage $V_{IN}$ plus the charge from the reference voltage $V_{REF}$ is never large enough to saturate the integrator 102. By accounting for the total amount of reference charge transferred to the integrator 102 during the RU and RD intervals, the digital output of the integrating ADC can be measured with much higher accuracy and resolution. To account for the total amount of reference charge transferred to the integrator 102, so-called "slope counts" can be preformed, as will be discussed in detail further below. Essentially, the "slope count" is the number of time intervals during which the integrator 306 is ramping positive minus the number of time intervals during which the integrator 306 is ramping negative.

Although the multisloping technique allows for improved resolution, the resulting time period for a reading may still be quite great for a high resolution output. For example, about 150 microseconds could be required to perform multislope run-down alone for a resolution of about six digits. Moreover, dedicated high-speed logic must be used for this purpose as well as custom-integrated circuitry which is quite expensive. It is thus desirable to shorten the time period for the RD interval so that speed can be improved and so that the ADC is more cost-effective without sacrificing resolution and linearity.

Copending application, Ser. No. 07/446,232, entitled "Integrating Analog to Digital Converter," filed Dec. 15, 1989, by R. Riedel, teaches a technique for substantially minimizing the RD interval via the addition of a conventional ADC to the integrator. The additional ADC measures the residual integrator output voltage $V_{INT-RES}$ which remains after the RU interval. The residual integrator output voltage $V_{INT-RES}$ is then converted into a fractional part of a slope count and added to the slope counts derived during the RU interval. As a result, the resolution and speed of the integrating ADC is enhanced.

FIG. 3 substantially represents the embodiment taught by Riedel. As shown in FIG. 3, an integrating ADC 300 has an integrator 306, a comparator 308, a logic/control circuit 310, and a residue ADC 312. During operation. Initially, switch SW4 is closed, switch SW3 is open, and the output of the integrator 306 is at zero. To begin a measurement, or "reading", switch SW4 is opened, switch SW3 is closed, and switches SW1, SW2 are opened by logic/control circuit 310. The output of the integrator 306 then begins to ramp positive as shown in Waveforms 1-3 of FIG. 4, due to the input voltage $V_{IN}$ in combination with the current source $I_3$. The integrator 306 is instructed by logic/control circuit 310 to ramp positive for a duration T/2, as shown, so that run-up always starts in the same direction. After a time period T/2, switches SW1, SW2 are closed, and the integrator 306 begins to ramp negative at a rate determined by the relative values of input voltages of $V_{IN}$, resistance $R_{IN}$, and the currents $I_1$, $I_2$, and $I_3$, where $I_1 = I_2 = I_3$.

After another time period T, the comparator output voltage $V_c$ of the comparator 308 is sampled. If the comparator output voltage $V_c$ is negative, switches SW1, SW2 are opened, and the integrator 306 again begins to ramp positive, as shown in Waveform 1 of FIG. 4. On the other hand, if the comparator output voltage $V_c$ is positive, switches SW1, SW2 are maintained closed, and the integrator 306 continues to ramp negative, as shown in Waveform 3 of FIG. 4. The foregoing process continues for as many time periods T as desired for the required resolution. The more time periods T used, the greater the resolution.

As is apparent from FIG. 4, the integrator output voltage Waveforms 1-3 are dependent upon the sign and magnitude of the input voltage $V_{IN}$. For example, Waveform 1 of FIG. 4 shows the response for a positive input voltage $V_{IN}$ whereby the integrator 306 slopes negative at a faster rate than the integrator 306 ramps positive, due to the inverting effect of the integrator 306. As a result, the overall slope count is positive. The slope count is the number of time intervals of duration T during which the integrator 306 is ramping positive minus the number of intervals of duration T during which the integrator 306 is ramping negative.

The integrator output voltage Waveform 2 of FIG. 4, on the other hand, illustrates the resulting slope for an input voltage $V_{IN}=0$. The resulting slope count is equal to zero because the integrator 306 ramps at the same rate in the positive and negative directions.

Finally, the integrator output voltage resulting from a negative input voltage $V_{IN}$ is illustrated in Waveform 3 of FIG. 4. For a negative input voltage $V_{IN}$, the integrator 306 ramps positive at a greater rate than the integrator 306 ramps negative, so that a negative slope count results. Thus, the integrator output has a steeper slope in a given direction in accordance with the magnitude of the input voltage $V_{IN}$, while the direction is determined at comparator 308 in accordance with the sign of the input voltage $V_{IN}$.

Hence, as previously described, a measure of the magnitude of the input voltage $V_{IN}$ may be obtained by computing the number of time durations T during which the comparator 308 exhibits a negative output (or, equivalently, the integrator is ramping positive) minus the number of time durations T during which the comparator 308 exhibits a positive output (or, equivalently, the integrator is ramping negative). Logic/control circuit 310 then samples the comparator output voltage $V_c$ of comparator 308 and computes the slope count. The slope count is used as the most significant digit part of the total ADC reading.

The unknown input voltage $V_{IN}$ is measured in the foregoing manner during the RU interval to a resolution determined by the number of time periods T in the measurement cycle. For example, 100 time periods T would imply a resolution of one part in 100, and of course, as the number of time periods T during run-up is increased, the output resolution is correspondingly increased.

During the RD interval, the residue ADC 312 functions as a successive approximation converter for calculating the residual integrator voltage $V_{INT-RES}$ remaining after the RU interval. Specifically, at the end of the RU interval, switches SW2, SW3 are opened. The integrator 306 is thus in a balanced state of input, and the output remains constant, at least for a short time period, as shown at the far right of integrator output voltage Waveforms 1-3 of FIG. 4.

As shown in FIG. 4, the integrator output voltage $V_{INT}$ will not necessarily be at zero volts at the end of the RU interval and will ordinarily vary from zero depending on the exact value of the input voltage $V_{IN}$. The remaining voltage is shown in FIG. 4 as a residual integrator voltage $V_{INT-RES}$. The least significant bits of the ADC digital output can be computed by precisely measuring the residual integrator voltage $V_{INT-RES}$ at the end of the RU interval.

The residual integrator voltage $V_{INT-RES}$ is converted into a fractional number of a slope count via a complex equation described by Riedel. The total slope count is equal to the sum of (1) the fractional number of slope counts derived from the residual integrator voltage $V_{INT-RES}$ and (2) the difference between the positive and negative slope counts derived during the RU interval.

In conclusion, the ADC 300 taught by Riedel provides for high speed and high resolution digital-to-analog conversions. However, the integrator 306 must be zeroed, or initialized, by the switch SW4 at the beginning of each count, and the input voltage $V_{IN}$ must be periodically switched off. In other words, although the ADC 300 taught by Riedel does not proceed through the entire RD interval, the ADC 300 must at least enter the RD interval in order to measure the residual integrator voltage $V_{INT-RES}$. The foregoing methodology is not optimal in terms of speed.

SUMMARY OF THE INVENTION

The present invention provides for a system and method for converting an input analog signal, which can be continuously applied, into an output digital signal. The system has an integrating means, a residue analog-to-digital converter (ADC), and control/output logic.

The integrating means integrates the input analog signal, which is combined with input reference signals so as to maintain the integrated output within predetermined voltage limits. The integrating means provides an integrator count, or slope count.

The residue ADC measures the integrated output at the beginning and end of a time interval corresponding to a reading. The integrated output sampled at the beginning of the time interval is the first residue voltage, whereas the integrated output sampled at the end of the time interval is the second residue voltage.

The control/output logic is connected to the integrating means and the residue ADC. The control/output logic converts the first and second residue voltages into a residue count. Moreover, it mathematically combines the residue count and the integrator count within the time interval of the reading so as to derive the output digital signal.

The present invention provides for a high resolution and high speed analog-to-digital conversion without the need for a run-down interval.

Another advantage of the present invention is that the integrator of an ADC need not be zeroed, or initialized, before commencing a reading. Moreover, readings can be performed contiguously, or back-to-back.

Yet another advantage of the present invention is that there is no need to terminate the input voltage $V_{IN}$ so that a high resolution result can be achieved. The input voltage $V_{IN}$, as well as the integrator, may be permitted to run continuously.

Another advantage of the present invention is that readings can be overlapped. Essentially, the integrating ADC aperture can be shaped. By changing the shape of the ADC aperture, the frequency response of the integrating ADC can be changed. As a result, undesirable noise signals, such as power supply noise (e.g., at 60 Hz), can be minimized or eliminated by manipulating the frequency response of the integrating ADC via overlapping the readings.

Still another advantage of the present invention is that the residue and integrator counts may be mathematically combined by a simple add operation if the gain on the residue ADC is manipulated. The gain may be adjusted via a digital-to-analog converter (DAC) or some other like means as described in the Detailed Description section of this document.

Further features and advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawings.

DETAILED DESCRIPTION OF THE PREFERRED EMBODIMENTS

Figure 1:
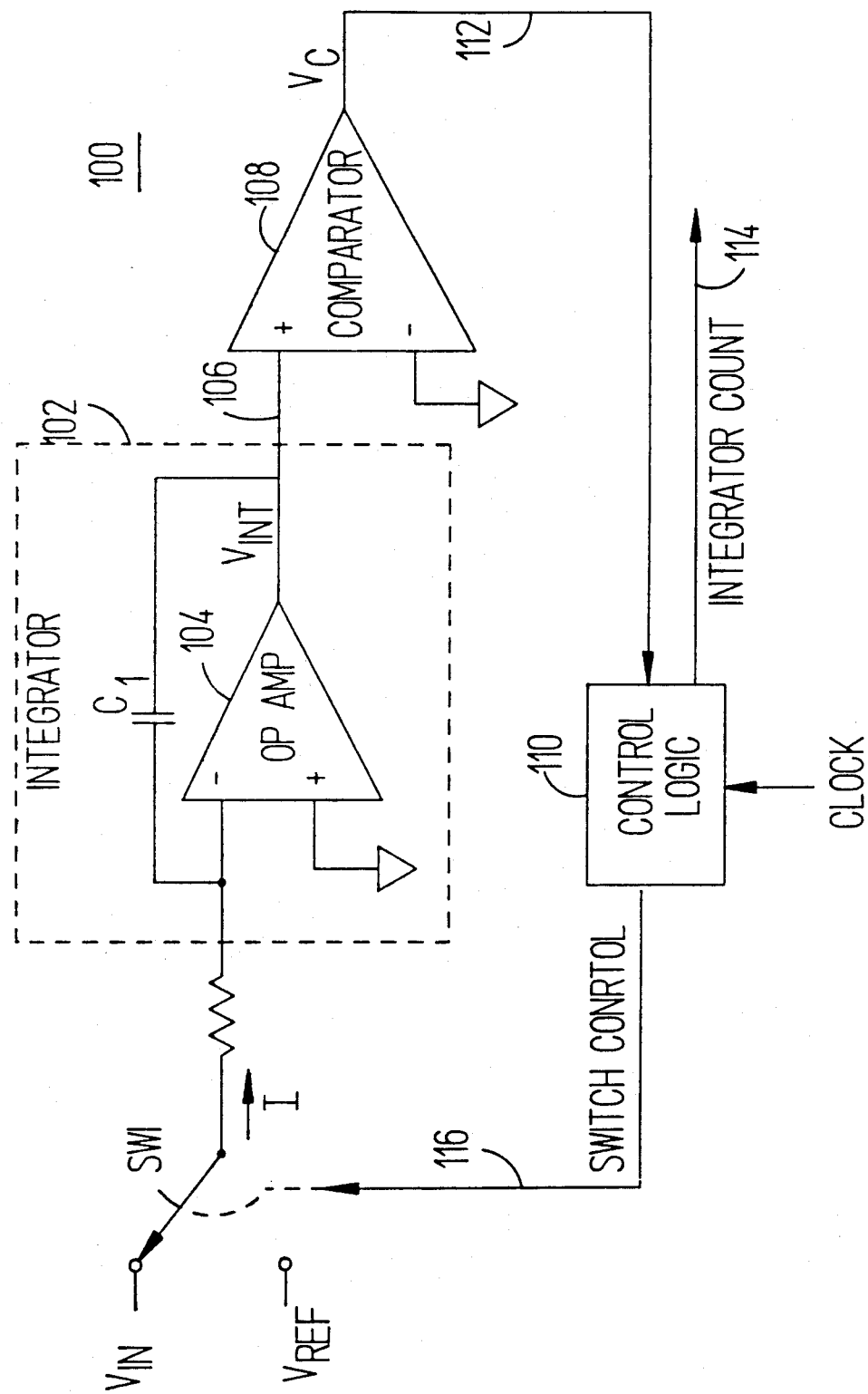
FIG. 1 is a block diagram of a conventional integrating analog-to-digital converter (ADC) for converting an input voltage $V_{IN}$ into a digital output signal via the use of a reference voltage $V_{REF}$.
Figure 2:
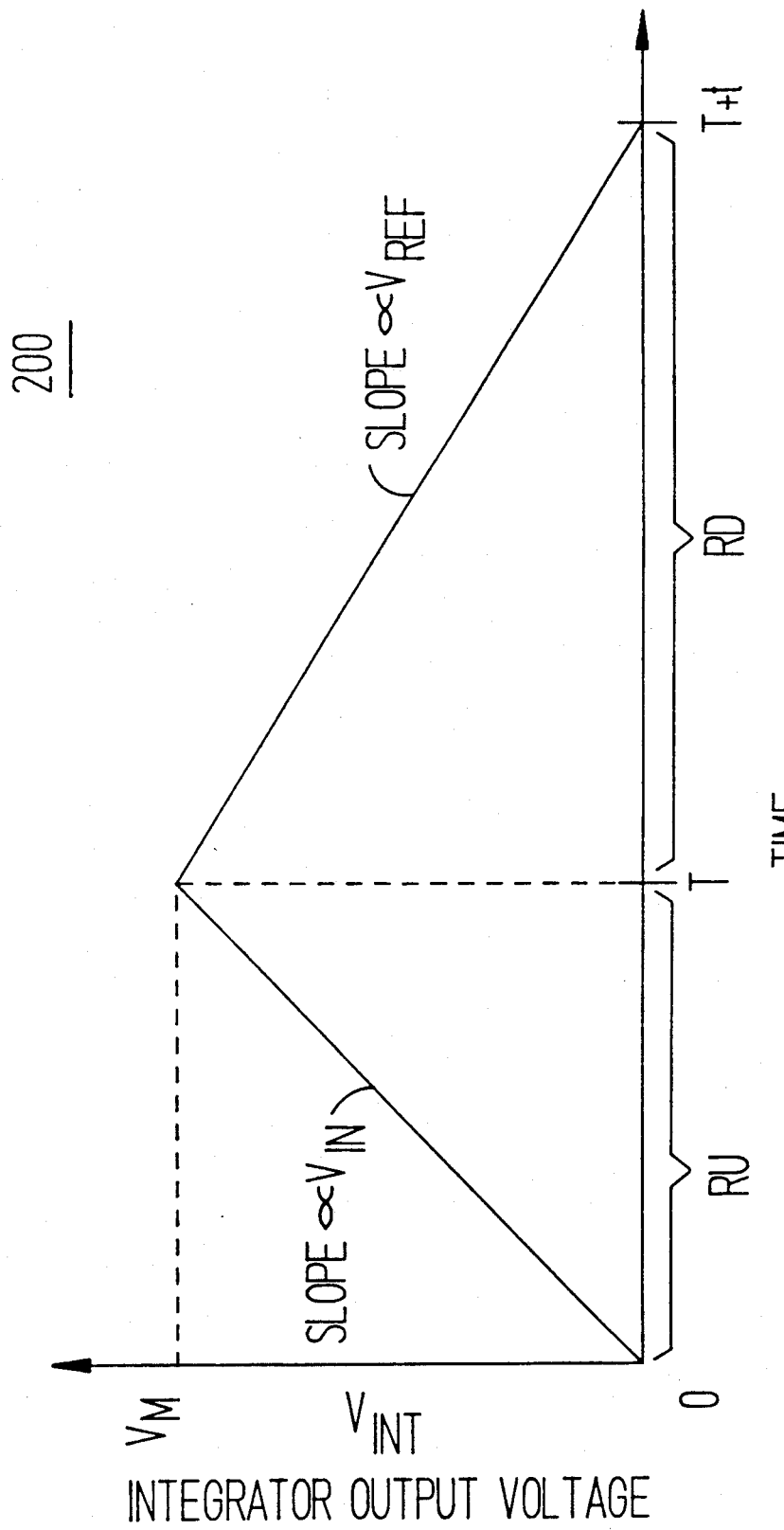
FIG. 2 is a plot of an integrator output voltage $V_{INT}$ as a function of time illustrating the conventional technique of dual-slope integration having a run-up (RU) time interval and a run-down (RD) time interval.
Figure 3:
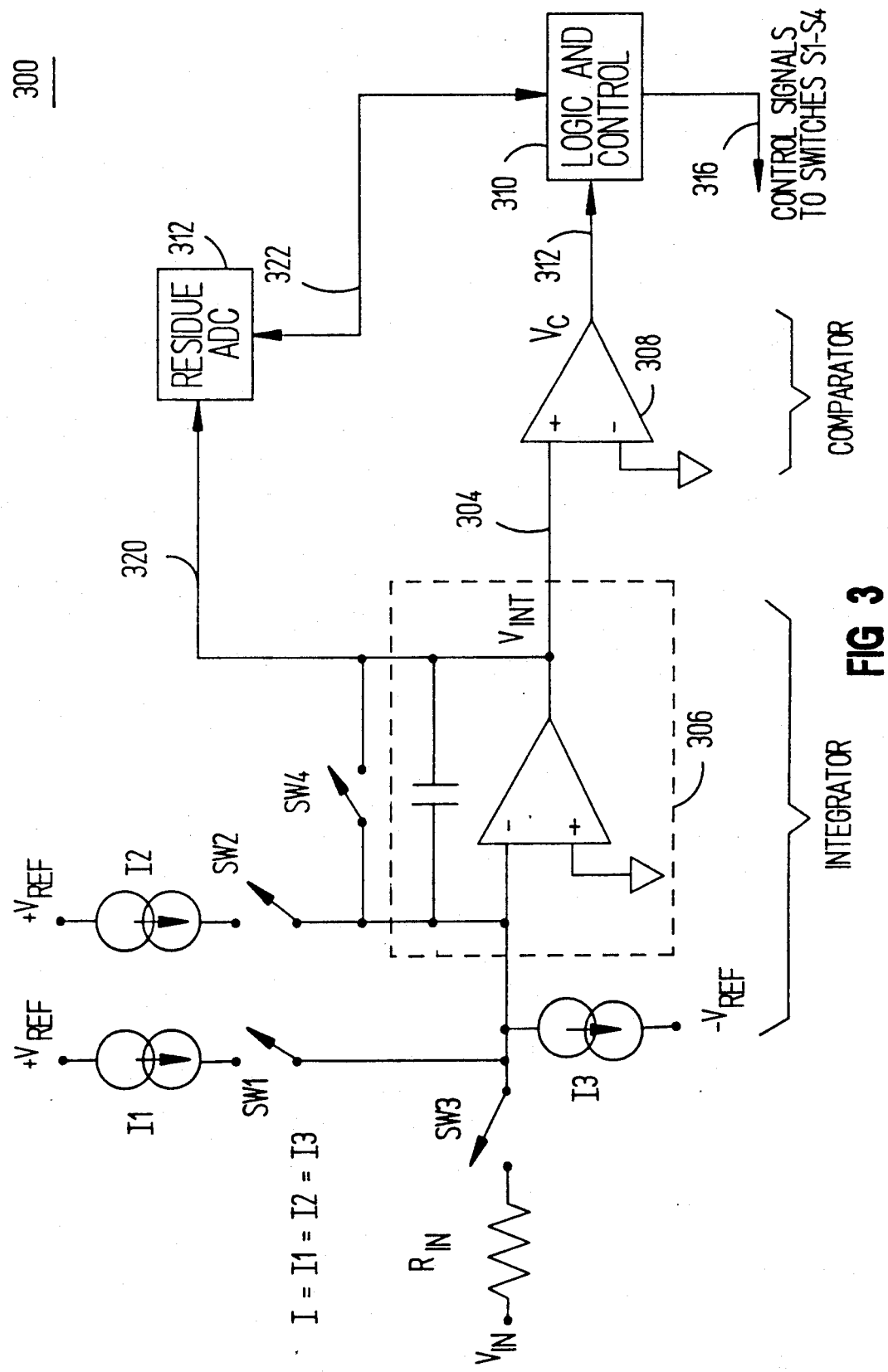
FIG. 3 is a block diagram of an integrating ADC in which the residual integrator voltage $V_{INT-RES}$ at the end of the RU interval is measured using a conventional ADC for the purpose of substantially eliminating the need for the RD interval.
Figure 4:
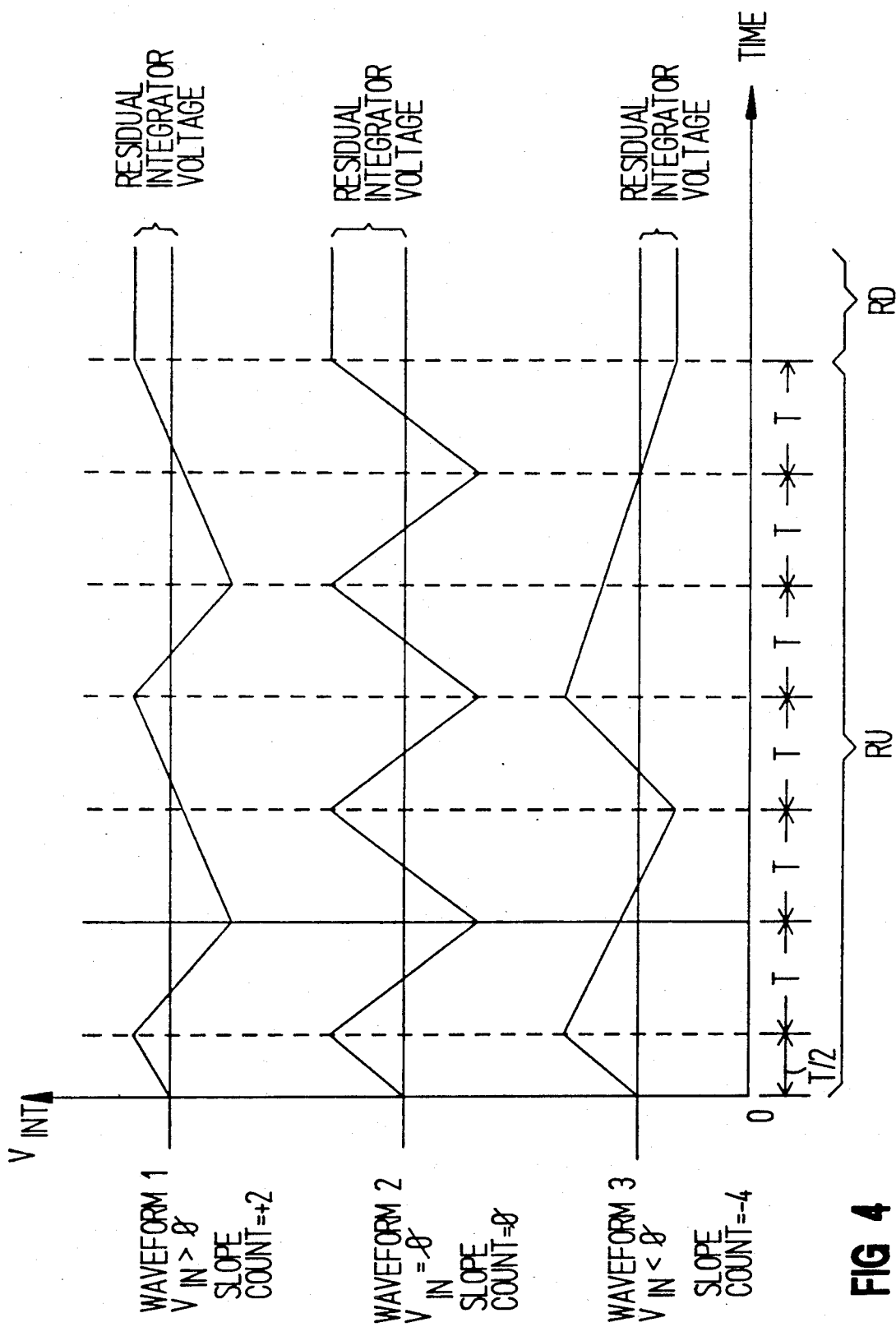
FIG. 4 illustrates a plot over time of the integrator output voltage $V_{INT}$ for the integrating ADC of FIG. 3 wherein multisloping is employed during the RU interval and wherein an input voltage $V_{IN}$ greater than zero, equal to zero, and less than zero, are shown respectively in the integrator output voltage Waveforms 1-3.
Figure 5:
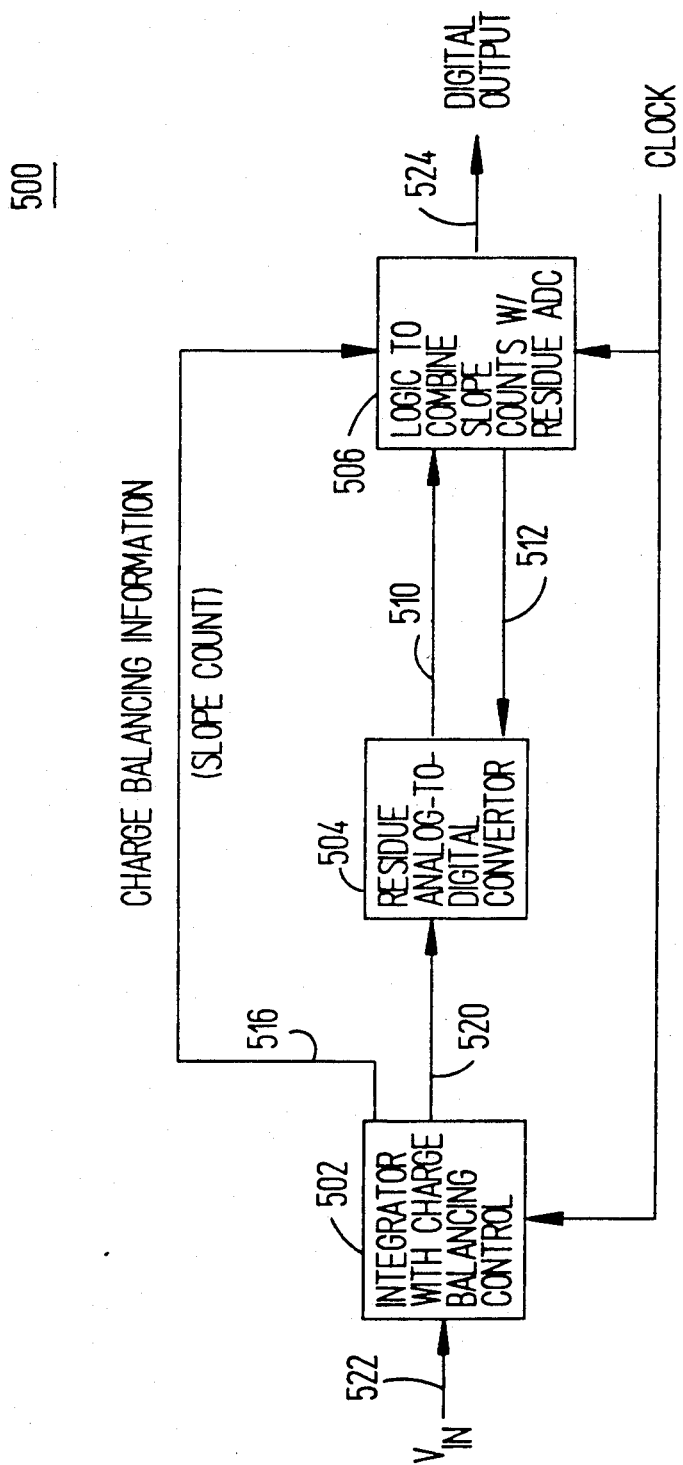
FIG. 5 is a block diagram of the present invention.

The present invention is illustrated in FIG. 5. Generally, the present invention is a continuously integrating ADC 500 having an integrator 502, a residue ADC 504, and control/output logic 506. The integrator 502 has charge-balancing control for coupling either a positive reference voltage $+V_{REF}$ or negative reference voltage $-V_{REF}$ to an unknown input voltage $V_{in}$, so as to implement multisloping as discussed previously in the background section of this document.

The residue ADC 504 can be any of a variety of commercially available ADCs, such as a successive approximation ADC, a flash ADC, a half-flash ADC, or any other means of converting an analog signal into a digital count. Moreover, the residue ADC 504 is configured to periodically measure, or sample, the integrator output voltage $V_{INT}$.

Unlike in the prior art, in the present invention a "reading" by the ADC 500 can begin at any point in time. The ADC 500 need not be zeroed in. A reading begins when the residue ADC 504 samples the integrator output voltage $V_{INT}$ for a first residue voltage. After the foregoing voltage sampling, the control/output logic 506 begins to count slope counts, which are continuously sent to the control/output logic 506 by the integrator logic 606. The reading ends after a duration T when the residue ADC 504 samples the integrator output voltage $V_{INT}$ for a second residue voltage. After the second voltage sampling, the control/output logic 506 ends the slope count for the particular reading.

In accordance with an important aspect of the present invention, control/output logic 506 combines the first and second residue voltages with the integrator slope count from the integrator logic 606 in order to derive a digital output with substantially increased resolution over a computation from merely the integrator slope count by itself. Significantly, the integrator 502 as well as the input voltage $V_{INT}$ is permitted to run continuously, although not a requirement. Hence, no counterpart corresponding to an RD interval exists in the present invention during operation.

Figure 6:
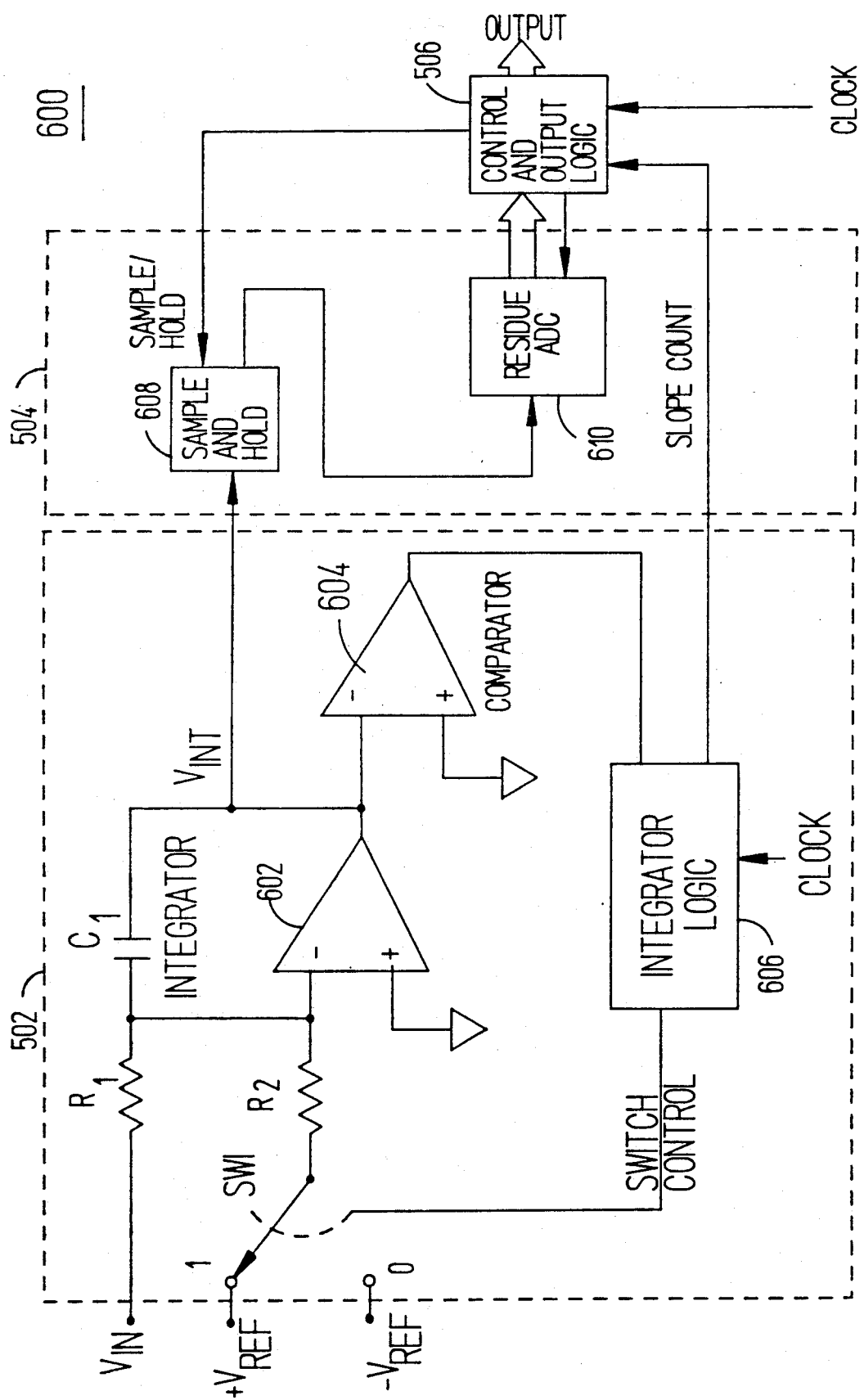
FIG. 6 is a block diagram of a first embodiment of the present invention.

FIG. 6 shows a first embodiment of the present invention. The first embodiment is merely a specific example of a possible construction. As shown, the integrator 502 receives the voltage input $V_{IN}$ along with either a positive reference voltage $+V_{REF}$ or a negative reference voltage $-V_{REF}$, depending upon the status of switch SW1. Although shown as reference voltages, the reference signals may take any of a number of different conventional manifestations, for example, a voltage source, current source, or charge pumping apparatus.

The preceding inputted voltages $V_{IN}, +V_{REF}, -V_{REF}$ are initially acted upon by the integrator comprised of an operational amplifier (op-amp) 602 and a capacitor $C_1$. A comparator 604 detects polarity changes in the integrator output voltage $V_{INT}$. Moreover, a charge balancing control, comprising resistors $R_1$, $R_2$ and integrator logic 606, is employed to control the reference voltages. Specifically, the integrator logic 606 controls a switch SW1 for alternately connecting either the positive reference voltage $+V_{REF}$ or the negative reference voltage $-V_{REF}$ to confine the integrator output voltage $V_{INT}$ within certain predetermined voltage limits. The integrator logic 606 further keeps track of the slope count and provides the slope count to the control/output logic 506, as shown by 514. In keeping track of the slope count, the integrator logic 606 merely counts the number of times in which the positive and negative reference voltages $V_{REF}$ are applied to the integrator.

The integrator output voltage $V_{INT}$ is fed into a sample/hold 608 so as to sharply capture a DC voltage in time. The output of the sample/hold 608 is forwarded to a residue ADC 610 as indicated. Generally, if a flash ADC were used for the ADC 610, then the sample/hold 608 may not be needed. However, the use of a successive approximation ADC for the residue ADC 610 would require the sample/hold 608.

The operation of the first embodiment shown in FIG. 6 proceeds as follows. The sample/hold 608 samples the integrator output voltage $V_{INT}$ at a time $t_0$. The residue ADC 610 converts the first residue voltage into a first residue count and provides the first residue count to the control/output logic 506. The control/output logic 506 in the meantime commences the counting of slope counts sent to it from the integrator logic 606, which continuously monitors the slope transitions of the integrator 502.

At a predetermined later time $t_0 + T$, the sample/hold 608 samples again the integrator output voltage $V_{INT}$. The second residue voltage from the integrator output voltage $V_{INT}$ is converted to a second residue count by the residue ADC 610, and the second residue count is forwarded again to the control/output logic 506. The control/output logic 506, at the same time, terminates the counting of slope counts sent to it from the integrator logic 606.

Next, the control/output logic 506 computes the difference between the first and second residue counts. The difference is mathematically scaled, directly or indirectly, by a calibration constant K in order to convert the difference into a fraction of a single slope count so that it can be added to the slope count from the integrator. The calibration constant K can change with temperature and time. The derivation of the calibration constant K can be derived in many different conventionally known ways. In the aforementioned Riedel disclosure, incorporated herein by reference, a usable technique is fully described and can be applied herein.

The fractional slope count, derived from the two residue counts, is added to the corresponding overall number of slope counts calculated during the reading. In essence, the overall slope count corresponds to the number of positive and negative reference charge applications to the integrator 502 during the time span between the two integrator output voltage samplings by the sample/hold 608.

Figure 7:
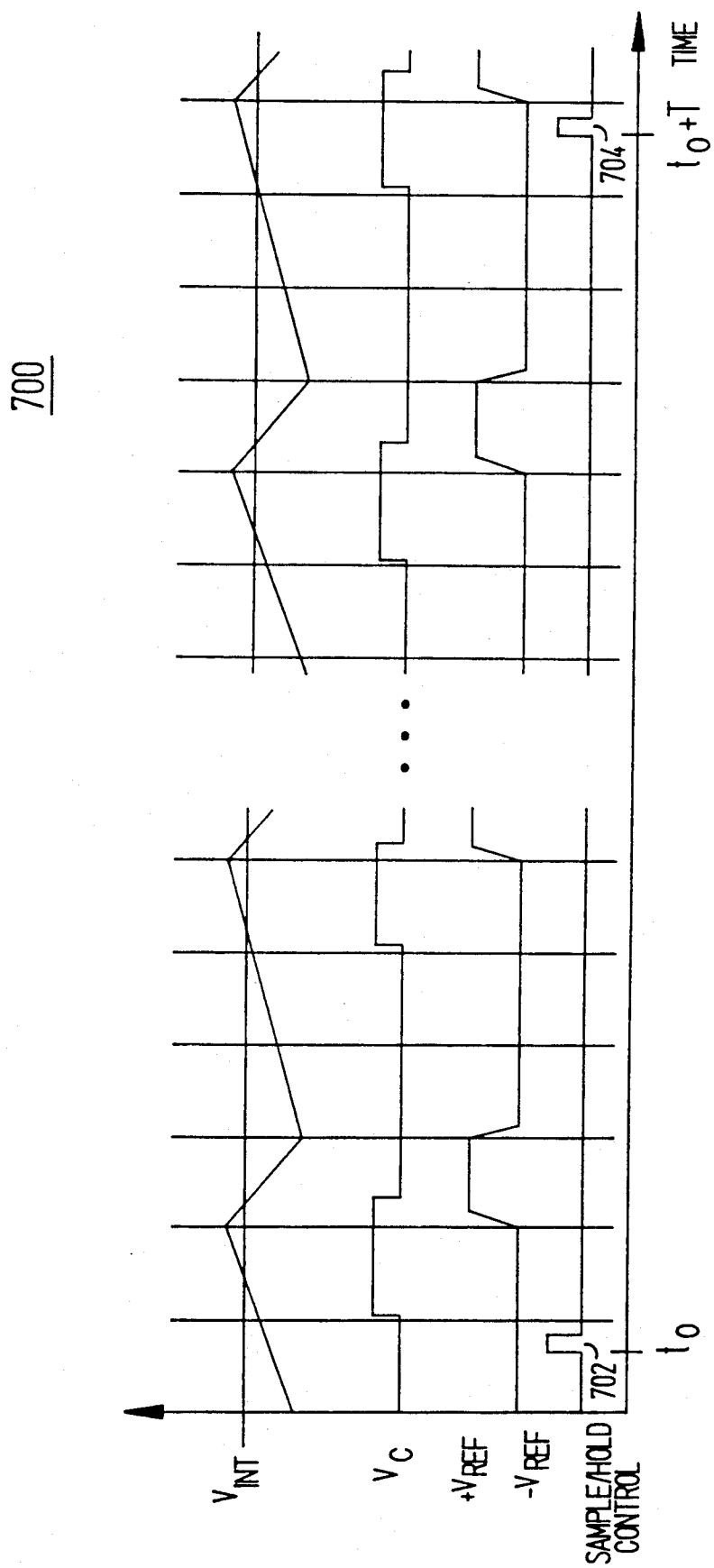
FIG. 7 illustrates plots over time of the integrator output voltage $V_{INT}$, the comparator output voltage $V_C$, the positive reference voltage $+V_{REF}$, and the negative reference voltage $-V_{REF}$ corresponding to the first embodiment shown in FIG. 6 in accordance with the present invention.

FIG. 7 shows the response of various signals in the exemplary first embodiment shown in FIG. 6. The signals plotted in FIG. 7 are the integrator output voltage $V_{INT}$, the comparator output voltage $V_C$, the applied reference voltages ($+V_{REF}, -V_{REF}$), and the sample/hold control signal. As shown, the integrator output voltage $V_{INT}$ is maintained within a predetermined voltage range by application of the reference voltages under the control of the integrator logic 606. Furthermore, as diagrammatically shown, the sample/hold 608 is turned on a first time, as indicated by a pulse 702 in order to measure a first integrator output voltage $V_{INT}$, and then a second time, as indicated by a pulse 704, in order to measure the integrator output voltage $V_{INT}$ again. The duration T is the time interval between the pulses 702 and 704.

Figure 8:
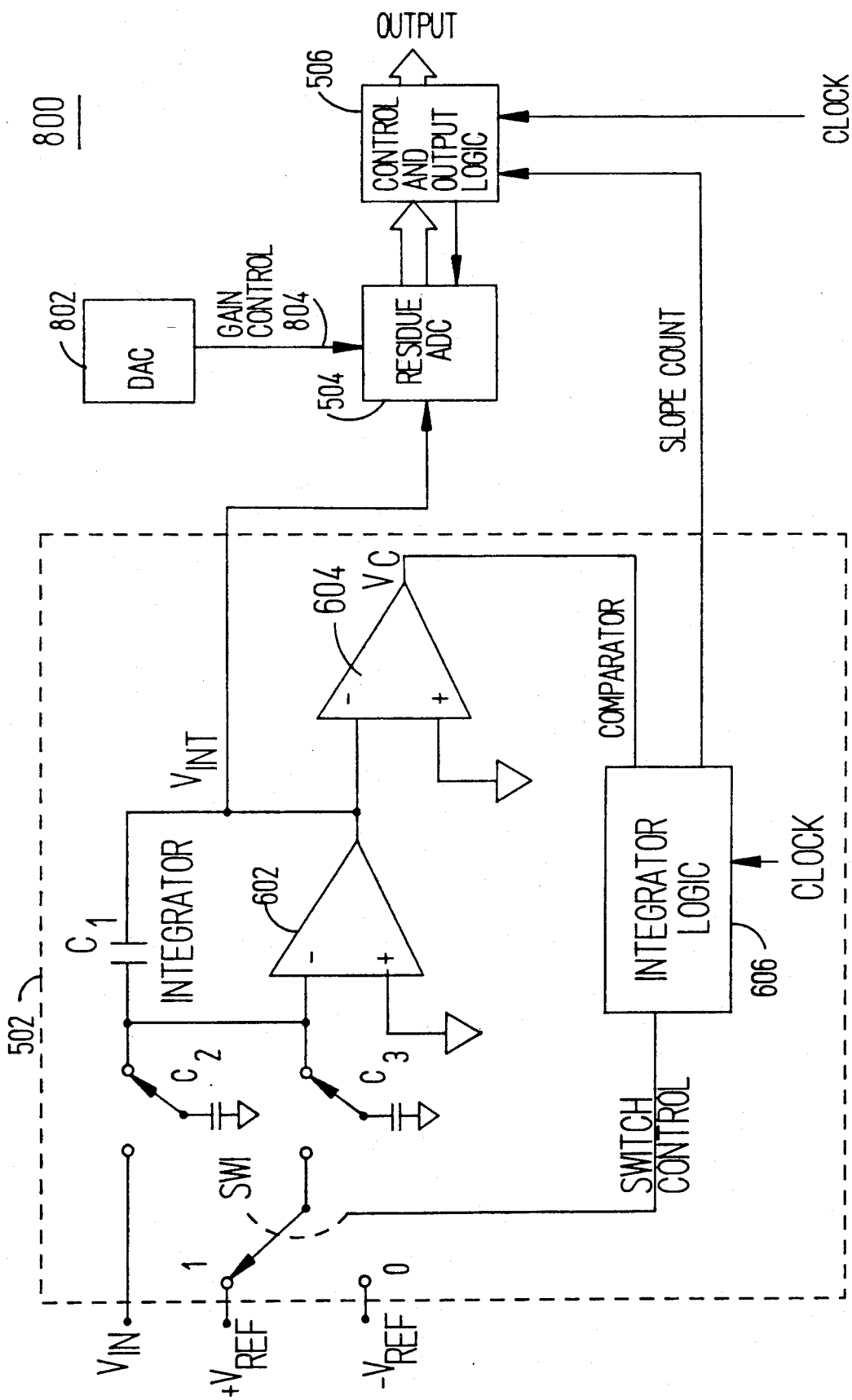
FIG. 8 is a block diagram of a second embodiment of the present invention wherein switched capacitors $C_2$, $C_3$ are utilized so as to eliminate the need for a sample/hold circuit and wherein a digital-to-analog convertor (DAC) is utilized to control the gain of the residue ADC so as to implement a calibration constant K, in effect.

FIG. 8 illustrates a second embodiment of the present invention. The second embodiment is merely a specific example of a possible construction of the present invention. Like the first embodiment, the second embodiment uses a charge-balancing integrator, but the charge is input by capacitors $C_2$, $C_3$. As shown, the capacitor $C_2$ is configured to charge up from the input voltage $V_{IN}$ and then discharge into the integrator. Moreover, the capacitor $C_3$ is configured to charge up from a reference voltage ($+V_{REF}$ or $-V_{REF}$) and then discharge into the integrator. Again, the comparator 604 is used to inform the integrator logic 606 whether to input charge from the positive or negative reference voltages so as to maintain the integrator 502 within voltage limits.

Significantly, the integrator output voltage $V_{INT}$ in the second embodiment exhibits the characteristics of a step function, which is well-known in mathematics. The integrator output voltage $V_{INT}$ is sampled by the residue ADC 504 when the slope of the integrator output voltage $V_{INT}$ exhibits a zero, non-changing slope. Hence, the implementation of the capacitors $C_2$ and $C_3$, which results in a step function at the integrator output voltage $V_{INT}$, can eliminate the need for a sample/hold device preceding the residue ADC 504.

Another significant feature of the present invention is that a digital-to-analog convertor (DAC) or the like may be implemented to control the gain of the residue ADC. Such a configuration is shown in FIG. 8. A DAC 802 feeds an analog signal to the gain control of the residue ADC 504. An advantage of this feature is that the residue ADC 504 can be adjusted so that the difference between the first and second residue voltages is effectively scaled by the applicable calibration constant K, where calibration constant K simplifies the math operation. In other words, the slope count from the integrator logic 606, associated with the integrator, can be simply shifted and then added to the difference between the first and second residue voltages.

Although two specific embodiments of the present invention are described in detail above, those skilled in the art will readily appreciate the many additional modifications that are possible without materially departing from the novel teachings and advantages of the present invention. Accordingly, all such modifications are intended to be included within the scope of the present invention as defined in the following claims.

The inventor claims the following:

1. A system for converting an input analog signal into an output digital signal, comprising:
   integrating means having an integrator configured to integrate said input analog signal combined with input reference signals, a comparator connected to said integrator configured to monitor polarity changes, and integrator logic connected to said comparator configured to control the application of said reference input signals and provide an integrator count;
   a residue ADC adapted to measure the integrated output at the beginning and end of a time interval to derive respective first and second residue voltages; and control logic connected to said integrating means and said residue ADC, said control logic configured to convert said first and second residue voltages into a residue count and configured to mathematically combine (1) said residue count, and (2) the integrator count within said time interval, so as to derive said output digital signal.

2. The system of claim 1, further comprising a means for mathematically multiplying said residue count by a calibration constant.

3. The system of claim 1, further comprising a means for controlling the gain on said residue ADC.

4. The system of claim 1, further comprising switching capacitors for providing said input analog signal and said reference input signals to said integrating means.

5. The system of claim 1, further comprising a sample and hold circuit connected between said integrating means and said residue ADC.

6. A method of computing an output digital signal from an input analog signal, comprising the steps of:
    integrating said input analog signal combined with input reference signals;
    sampling a first integrated output voltage to commence a reading;
    counting said reference input reference signals;
    sampling a second integrated output voltage to terminate said reading; and
    computing said output digital signal by mathematically combining (1) the difference between said first and second integrated output voltages and (2) the count of input reference signals during said reading.

7. The method of claim 6, further comprising the step of commencing a second reading after a first reading has already been commenced, but not terminated, thereby overlapping readings.

8. The method of claim 6, further comprising the step of commencing and terminating a second reading after a first reading has been commenced but not terminated, thereby overlapping readings.

9. The method of claim 6, further comprising the step of combining said input reference signals with said input analog signal so as to maintain the integrated output voltage within predetermined signal limits.

10. The system of claim 6, further comprising the steps of:
    multiplying said difference between said first and second integrated output voltages by a calibration constant to derive a modified residue count; and
    adding said modified residue count to said count of input reference signals to derive said output digital signal.

* * * * *